United States Patent

Kunishi et al.

[11] Patent Number: 5,356,299
[45] Date of Patent: Oct. 18, 1994

[54] TERMINAL ELEMENT OF A SURFACE-APPLIED TYPE ELECTRIC CONNECTOR

[75] Inventors: Shinsuke Kunishi, Ohsaka; Masaaki Ohya, Yokohama, both of Japan

[73] Assignee: Molex Incorporated, Lisle, Ill.

[21] Appl. No.: 58,104

[22] Filed: May 6, 1993

[30] Foreign Application Priority Data

Jun. 19, 1992 [JP] Japan .............................. 4-049080[U]

[51] Int. Cl.⁵ .............................................. H01R 9/09
[52] U.S. Cl. ........................................ 439/83; 439/78
[58] Field of Search ............... 439/60, 65, 76, 78–83, 439/733, 869, 870, 876

[56] References Cited

U.S. PATENT DOCUMENTS

| | | |
|---|---|---|
| 4,560,218 | 12/1985 | Billman et al. |
| 4,726,793 | 2/1988 | Bright .................................... 439/751 |
| 4,898,539 | 2/1990 | Glover et al. ........................... 439/81 |
| 4,978,308 | 12/1990 | Kaufman ................................ 439/83 |
| 5,145,384 | 9/1992 | Asakawa et al. ...................... 439/78 |
| 5,201,663 | 4/1993 | Kikuchi et al. ........................ 439/83 |
| 5,203,710 | 4/1993 | Miyazawa .......................... 439/83 X |

FOREIGN PATENT DOCUMENTS 2168550  11/1985  United Kingdom .

Primary Examiner—Khiem Nguyen
Attorney, Agent, or Firm—Stephen Z. Weiss

[57] ABSTRACT

Disclosed is a connector mounted to the surface of a printed circuit board including a housing having terminal receiving recesses and a plurality of terminals stamped from a surface plated metal sheet. The terminals have an intermediate section with a vertical axis, a lower section extending from the intermediate section with a transition section located out of the vertical axis and being generally C-shaped and a generally horizontal foot extending from the transition section and aligned with the vertical axis.

7 Claims, 4 Drawing Sheets

TERMINAL ELEMENT OF A SURFACE-APPLIED TYPE ELECTRIC CONNECTOR

BACKGROUND OF THE INVENTION

1. Field of Invention

The present invention relates to a surface-applied type electric connector, and more particularly to the improvement of the soldering tail of such surface-applied type electric connector.

2. Description of Prior Art

Surface-applied type electric connectors have been widely used, and as is well known, such an electric connector has a soldering tail to be soldered to a selected conductor on a printed circuit board.

One such conventional surface-applied type electric connector is stamped from a plated metal sheet including a base and an integrally connected solder tail. Since the portion of the solder tail contacting the printed circuit board was an unplated edge cut from a plated metal sheet, this unplated cut edge had to be plated at a later manufacturing step because an unplated surface would not assure firm soldering to a selected conductor strip on a printed circuit board. This extra plating results in an increase of the manufacturing cost.

Another conventional surface applied type electrical connector has a solder tail with a foot bent at a right angle from a portion of the terminal so that a plated surface of the terminal will be in contact with a solder pad over a conductor strip on a printed circuit board when the connector is placed on the printed circuit board. With only one right angle bend, there is some but not enough flexibility in the solder tail foot to insure contact with all of the selected conductor strips on the printed circuit board in the event of board warpage. Also, this single right angle bend offsets the placement location of the connector housing. This offset requires additional housing tolerances and labor in the assembly operation to ensure that accurate connector placement occurs.

SUMMARY OF THE INVENTION

One object of the present invention is to provide a stamped terminal structure which permits use of a selected portion of the plated surface of a plated metal sheet for making a solder tail with a flexible solder tail foot, thereby eliminating the extra plating step which is required in making the conventional terminal elements and providing flexibility to insure each foot is in contact with corresponding portions of the printed circuit board. In the event the board is warped.

To attain this object the present invention is provided including generally, a connector mounted to a surface of a printed circuit board. The connector includes a housing having a board mounting face, a connector mounting face, and a plurality of elongated terminal receiving recesses parallel to each other and extending within the housing. A plurality of stamped terminals are mounted in the recesses, each terminal having a base section, a generally elongated intermediate section extending from the base section with a vertical axis, a lower section extending from the intermediate section and a generally horizontal foot extending from the lower section with a solder region adapted to be secured to a conductor strip on the surface of the printed circuit board. The lower section has a transition section located out of the vertical axis of the intermediate section and the generally horizontal foot aligned with and centered on said vertical axis.

According to another aspect of the invention the transition section of said terminal is generally C-shaped. According to still another aspect of the invention the terminal is stamped from a surface plated metal sheet and formed so that a surface of the horizontal foot in contact with the conductor strip on the printed circuit board will be plated. According to a further aspect of the invention each terminal receiving recess has a mounting slot and each terminal has a mounting section adapted to be held in the mounting slot.

DETAILED DESCRIPTION OF PREFERRED EMBODIMENT

Figure 1:
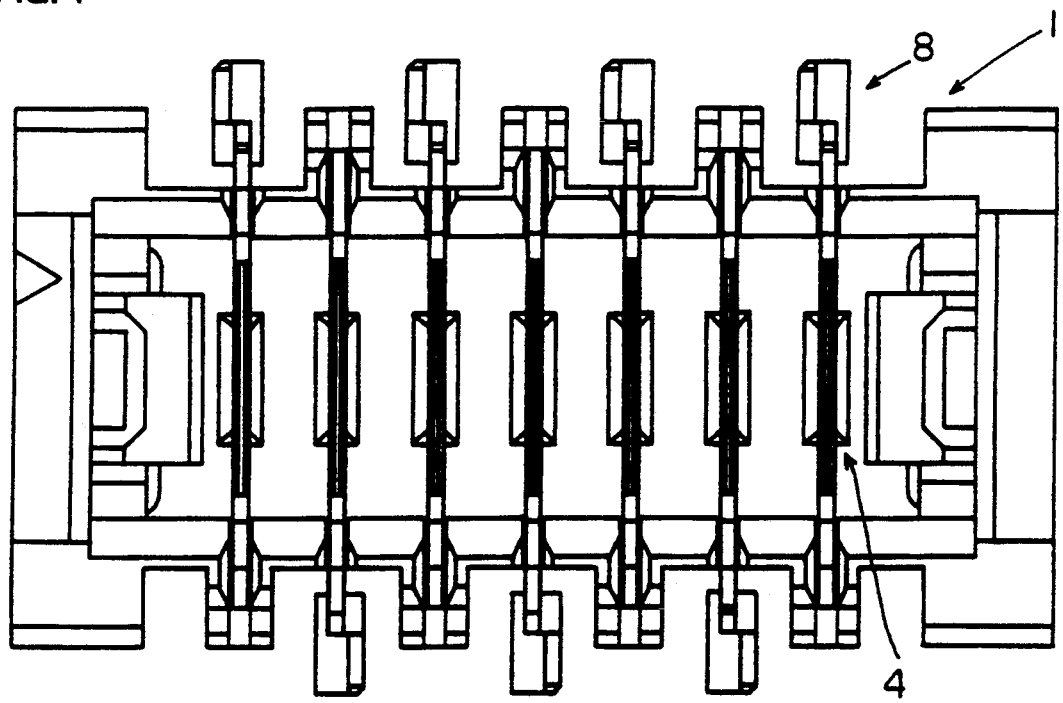
FIG. 1 is a plane view of a surface-mounted electric connector which has a plurality of terminal elements fitted therein.

Referring to the drawings in greater detail and first to FIG. 1, the invention is depicted in an electrical connector construction or assembly, generally designated 1, which includes a unitary dielectric housing, generally designated 2, molded of plastic. This housing has an upper connector mating face 19 and a lower board mounting face 20. The housing has a plurality of elongated terminal receiving recesses 3 extending through the connector mating face into the housing. Each recess 3 has a mounting slot 10 located within the recess and extending toward the board mounting face 20 of the housing. As will be better understood below, after a description of the terminals, the elongated terminal receiving recesses 3 and mounting slots 10 are adapted for receiving a positioning the terminals, generally designated 4, which are inserted into the housing through the connector mating face 19.

Extending beyond the board mounting face 20 are board locks 15. These board locks are adapted to penetrate through apertures (not shown) in the printed circuit board 17. The board locks will hold the connector 1 in place thereby holding the terminal solder tails against conductor strips on the printed circuit board 17 prior to soldering.

Figure 4:
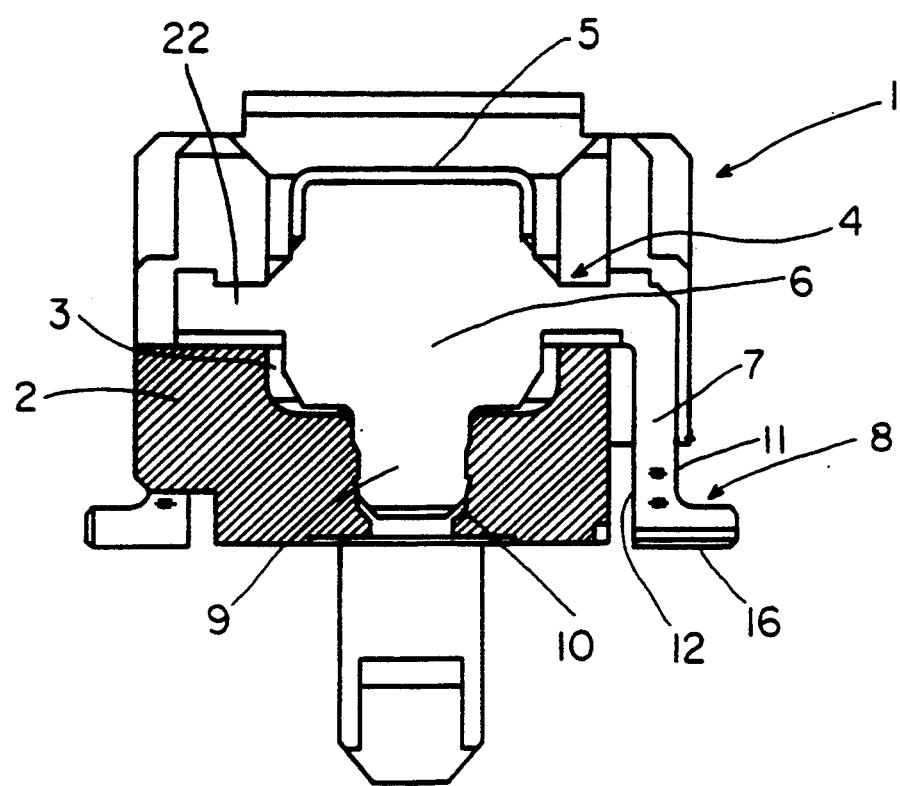
FIG. 4 is a section view taken along the line 4—4 in FIG. 2.

Referring to FIG. 4, the terminal 4 is a metal component stamped from a plated sheet of metal. The terminal includes a base section 6, a mating section 5, a mounting section 9, an intermediate section 7 extending from one edge of the base section and a lower section 8 extending from the intermediate section 7. The intermediate section 7 is in the form of an L-shaped arm and is adapted to fit into a portion of the terminal receiving recesses passing through two sides of the housing. A stub arm 22 extends from an edge of the base section 5 opposite the intermediate section 7. The stub 22 and the horizontal portion of the intermediate section 7 act to locate and hold a portion of the terminal in the terminal receiving recesses. The terminals are inserted into the recesses with every other one rotated 180 degrees so that the horizontal foot 16 alternates from side to side.

The mounting section 9 is adapted to tightly fit within the mounting slot 10 which is a part of the elongated terminal recesses 3 of the housing. The intermediate section 7 extends toward the printed circuit board and ends in the lower section 8 which contacts a conductor strip on the printed circuit board.

Figure 5:
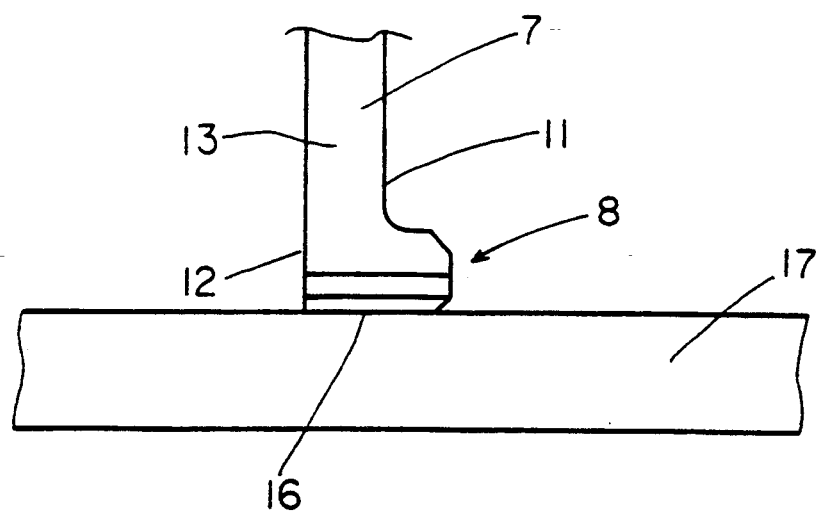
FIG. 5 is an enlarged left side view of the soldering tail and leg section of the terminal.
Figure 6:
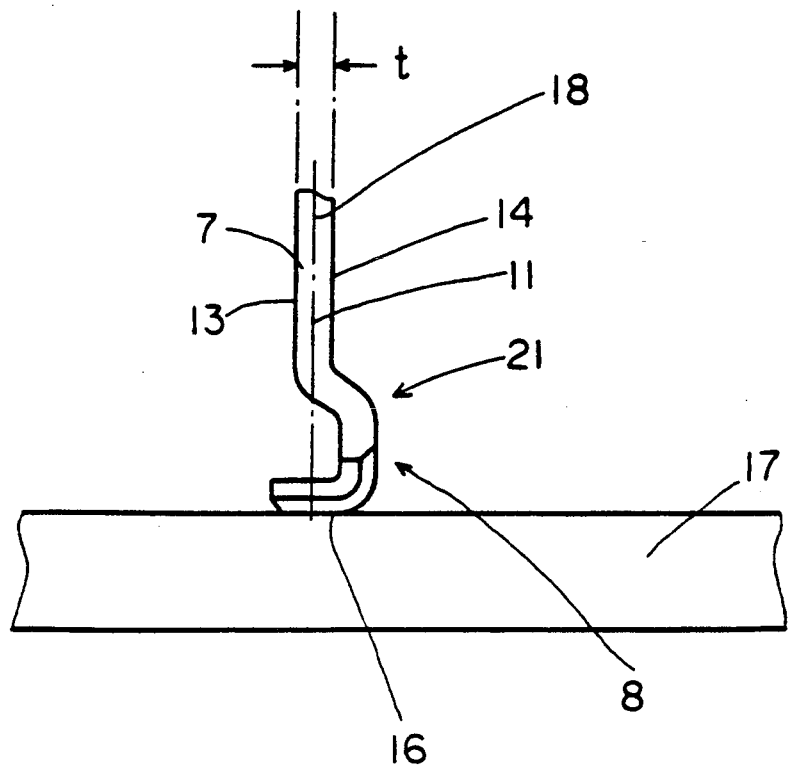
FIG. 6 is an enlarged front view of the soldering tail-and-leg section of the terminal.
Figure 7:
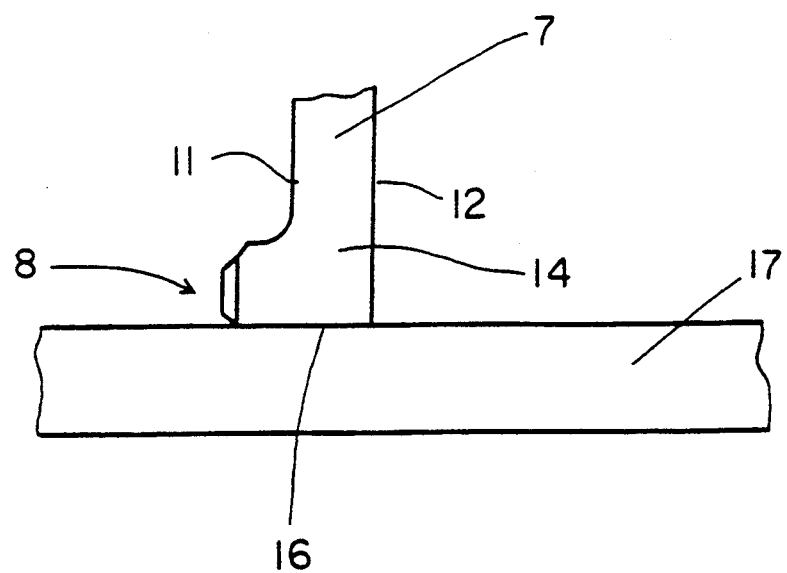
FIG. 7 is an enlarged right side view of the soldering tail and leg section of the terminal.

FIGS. 5, 6 and 7 show details of the lower section 8. Extending from the intermediate section 7 is the lower section 8. This lower section consists of generally two parts. One part is the generally horizontal foot 16 which is adapted to contact a conductor strip on a printed circuit board and a transition section 21 extending between the intermediate section and the horizontal foot 16. The transition section 21 is located out of the vertical axis 18 of the intermediate section 7. The horizontal foot 16 is located directly under and generally perpendicular to the vertical axis 18 of the intermediate section.

The portion of the horizontal foot 16 contacting the conductor strip on the printed circuit board includes plated surface 14. The other plated surface 13 is parallel to and opposite the plated surface 14. Unplated edges 11 and 12 are also shown.

Figure 2:
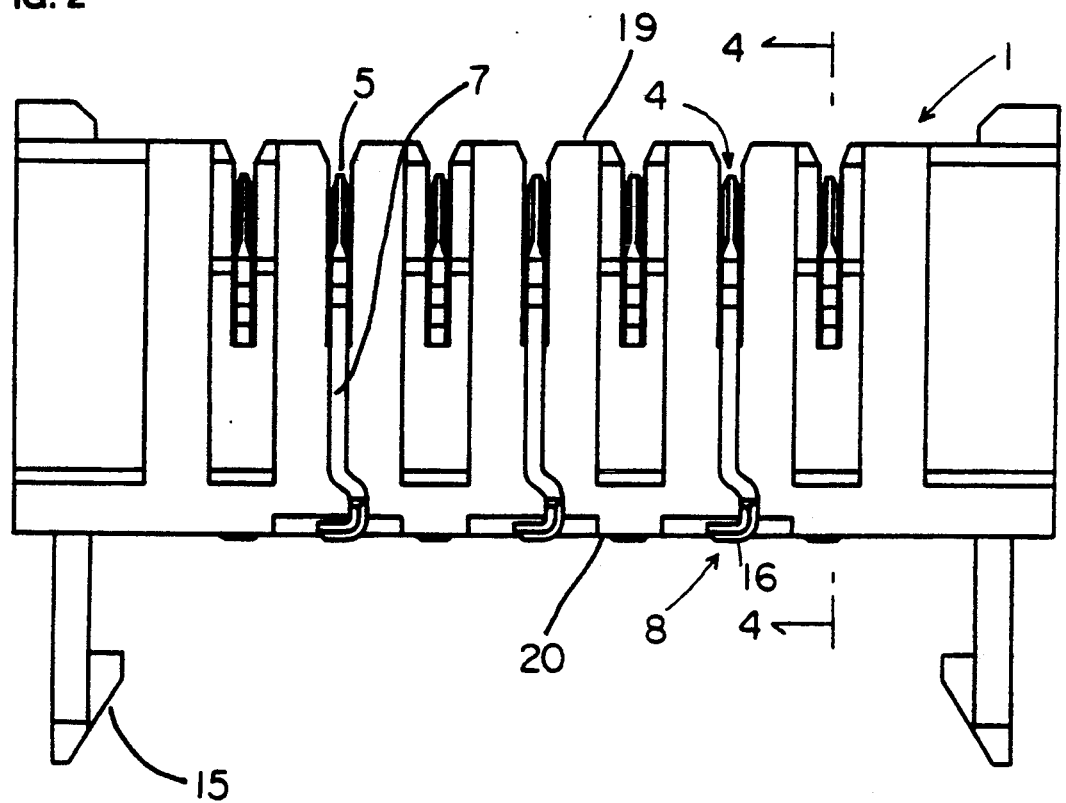
FIG. 2 is a front view of the surface-mounted electric connector.
Figure 3:
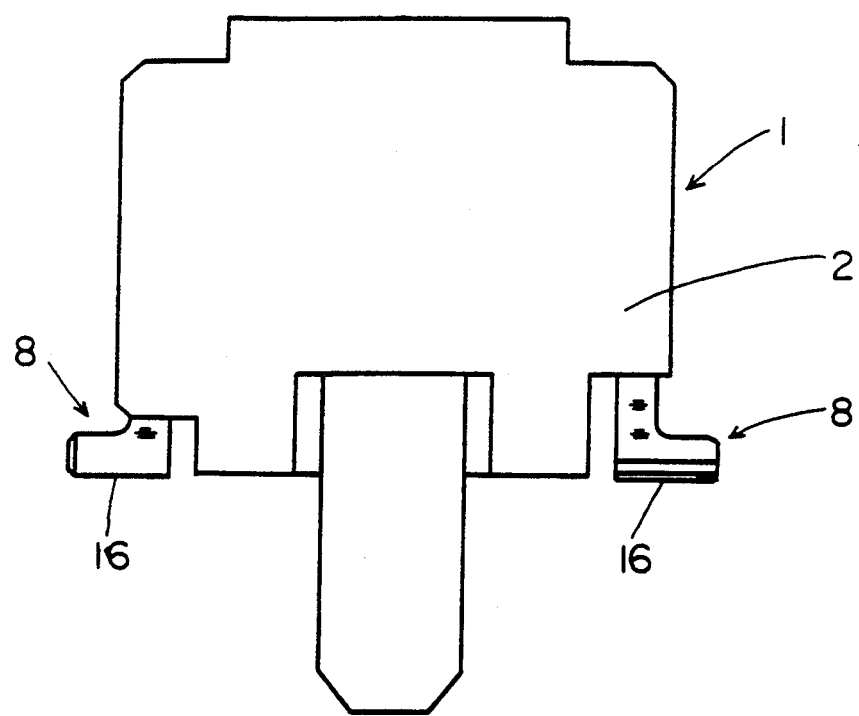
FIG. 3 is a right side view of the surface-mounted electric connector.

Referring to FIG. 2, it is clear to see that laterally locating the upper mating portion 5 of the terminals will also laterally locate the lower generally horizontal foot 16 because the horizontal foot 16 is generally aligned with the vertical axis 18 of the intermediate section 7. This facilitates the precise positioning of the electrical connector relative to selected conductor strips on the underlying printed circuit board 17.

Also referring to FIGS. 2 and 4, the horizontal foot 16 can be designed to extend slightly below the board mating face 20 of the connector housing 2. Because of the flexibility inherent in the C-shaped transition 21 section which connects the horizontal foot 16 to the intermediate section 7, the horizontal foot 16 can flex to accommodate warpage in the printed circuit board so that the horizontal feet 16 of all of the terminals will make contact with associated conductor strips on the printed circuit board 17.

While the present preferred embodiment of the invention has been shown and described, it is to be distinctly understood that the invention is not limited thereto but may be otherwise variously embodied within the scope of the following claims.

We claim:

1. A connector mounted to a surface of a printed circuit board including:
   a housing having a board mounting face, a connector mating face, and a plurality of elongated terminal receiving recesses parallel to each other and extending within the housing each recess defining a plane,
   a plurality of stamped terminals having two surfaces mounted in the recesses, each terminal having a base section, a generally elongated intermediate section extending from the base section with a vertical axis, a lower section extending from the intermediate section and a generally horizontal foot extending from the lower section with a solder region adapted to be secured to a conductor strip on the surface of the printed circuit board,
   the improvement comprising:
   the base and intermediate sections having a plane located in the same plane as each respective recess,
   the lower section including a transition section located out of the vertical axis of the intermediate section and the generally horizontal foot aligned with and centered on said vertical axis and bent so that one of the surfaces of the terminal in the horizontal foot is parallel to and in contact with the conductor strip of the surface of the printed circuit board.

2. A connector according to claim 1, wherein said transition section of said terminal is generally C-shaped.

3. A connector according to claim 2 wherein said terminal is stamped from a metal sheet with one of said surfaces plated and formed so that a surface of the horizontal foot in contact with the conductor strip on the printed circuit board will be plated.

4. A connector according to claim 3 wherein said terminal is a blade type.

5. A connector according to claim 3 wherein said elongated terminal receiving recesses pass through said housing connector mating face.

6. A connector according to claim 4, wherein each of said terminal receiving recesses have a mounting slot and each of said terminals have a mounting section adapted to be held in said mounting slot.

7. A connector according to claim 1 wherein said intermediate section also extending laterally from said base section.

* * * * *